United States Patent [19]

Itoh

[11] Patent Number: 5,784,150
[45] Date of Patent: Jul. 21, 1998

[54] ELECTRON-BEAM CELL PROJECTION LITHOGRAPHY SYSTEM

[75] Inventor: Katsuyuki Itoh, Tokyo, Japan

[73] Assignee: NEC Corporation, Tokyo, Japan

[21] Appl. No.: 749,956

[22] Filed: Nov. 14, 1996

[30] Foreign Application Priority Data

Nov. 15, 1995 [JP] Japan ................................ 7-296548

[51] Int. Cl.$^6$ ................................................. G03B 27/42
[52] U.S. Cl. .............................. 355/53; 355/67; 355/71
[58] Field of Search ............................. 355/43–45, 53,
355/66, 67, 71; 378/34, 205, 209; 250/397,
398, 492.1, 492.2, 491.1

[56] References Cited

U.S. PATENT DOCUMENTS

| | | | |
|---|---|---|---|
| 4,119,854 | 10/1978 | Tanaka et al. | 250/397 |
| 5,036,209 | 7/1991 | Kataoka et al. | 250/492.2 |
| 5,153,441 | 10/1992 | Moriizumi | 250/492.2 |
| 5,438,207 | 8/1995 | Itoh et al. | 250/492.23 |
| 5,639,323 | 6/1997 | Jordon | 156/64 |
| 5,659,384 | 8/1997 | Ina | 355/53 |

FOREIGN PATENT DOCUMENTS 2-237107  9/1990  Japan .

OTHER PUBLICATIONS

Nakayama et al., "Highly Accurate Calibration Method of Electron–Beam Cell Projection Lithography", SPIE vol. 1924:183–192, (1993).

*Primary Examiner*—D. Rutledge
*Attorney, Agent, or Firm*—Foley & Lardner

[57] ABSTRACT

An electron-beam cell projection lithography apparatus includes an electron-beam source, a first aperture through which an electron-beam transmitted from the electron-beam source passes is shaped, and a second aperture formed with an aperture in a desired transfer pattern. The electron beam passes through the second aperture and irradiates an object. The second aperture is placed on a stage, which is movable in X and Y axes directions. A registration mark is placed or positioned on at least one of the second aperture and the stage. The apparatus also includes a device such as a microscope, a charge coupled device (CCD) for observing the registration mark to position the second aperture. The observing device has variable magnifications. The second aperture can be positioned by observing the registration mark with the observing device having variable magnifications. Thus, the second aperture is first roughly positioned by virtue of the registration mark by observing the second aperture and a wide area of the stage with the observing device adjusted to have low magnifications, and then accurately positioned with the observing device adjusted to have high magnifications. Thus, it is possible to align the registration mark with a reference point in a short period of time, thereby accomplishing rapid positional adjustment of the stage on which the second aperture is placed. In addition, since the second aperture can be wholly observed, it is possible to find defects and damages of a transfer pattern.

11 Claims, 4 Drawing Sheets

ELECTRON-BEAM CELL PROJECTION LITHOGRAPHY SYSTEM

BACKGROUND OF THE INVENTION

1. Field of the Invention

The invention relates to an electron-beam cell projection lithography apparatus for transferring a pattern formed on a transfer mask to an object with electron-beam, and more particularly to such an apparatus capable of positioning a transfer mask on a stage with high accuracy.

2. Description of the Related Art

With a semiconductor device being reduced more and more in size, a conventional optical lithography system is being replaced with an electron-beam lithography system in which electron-beam is used for directly transferring a pattern on an object such as a semiconductor wafer. The electron-beam lithography system provides high resolution, but has a problem of small throughput. In order to solve this problem, a transfer mask using system has conventionally been used such as all-in projection process and block lithography process.. In such a conventional system, for instance, a transfer mask formed with an aperture in a desired pattern is placed on a stage, and electron-beams are made to pass through the aperture to thereby produce electron-beams shaped in the desired pattern, which are projected to a semiconductor wafer to thereby transfer the pattern thereon. The transfer mask is usually made of material capable of not allowing electrons to pass therethrough, and being readily processed. For instance, the transfer mask is typically made of silicon. The method of fabricating the transfer mask as mentioned above is suggested, for instance, in Y. Nakayama et al., "Highly accurate calibration method of electron-beam cell projection lithography", SPIE Vol. 1924 (1993), pp 183-192.

FIG. 1 is a cross-sectional view of one of conventional electron-beam projection lithography apparatuses. Electron beam 302 transmitted from an electron-beam source 301 in a main chamber 300 is shaped in a rectangular beam by a first aperture 303, and then radiated to a second aperture 307 through a first beam shaping lens 304a and a first beam shaping deflector 305a. The second aperture 307 is formed with an aperture in a desired pattern, and hence acts as a transfer mask. The electron-beam 302 is shaped in the desired pattern by the second aperture 307. Then, the electron-beam 302 is radiated to a substrate 308 placed on a stage 309 through second and third beam shaping lenses 304b, 304c and beam shaping deflectors 305b, 305c. Thus, all-in pattern transfer is accomplished.

In the above mentioned lithography apparatus, a stage 306 on which the second aperture 307 is to be placed is designed to be horizontally movable. When the second aperture 307 is placed on the stage 306, the stage 306 is first moved out of the main chamber 300 and into a sub-chamber 312 disposed in connection with the main chamber 300. In the sub-chamber 312, the second aperture 307 is placed on the stage 306, and then θ angle compensation is manually and accurately carried out. Herein, θ angle compensation means an adjustment as to a direction of the pattern formed on the second aperture 307 in X-Y plane.

Then, the sub-chamber 312 is evacuated of air, and a leakage valve 311 communicating the main chamber 300 with the sub-chamber 312 is opened. Then, a jig such as a setting rod 310 is used to push the second aperture 307 together with the stage 306 into the main chamber 300, and subsequently, the stage 306 is positioned in place and fixed there. When the second aperture 307 is to be exchanged to another aperture having a different pattern, the second aperture 307 is taken out of the main chamber 300 in a manner opposite to the above mentioned manner.

The above mentioned lithography apparatus positions the second aperture 307 in the sub-chamber 312 only with respect to the above mentioned θ angle. Hence, it is necessary to position the second chamber 307 in the main chamber 300 with respect also to a position in X and Y axes directions. A method of such positioning is suggested in Japanese Unexamined Patent Publication No. 2-237107, which is hereinbelow explained.

As illustrated in FIG. 2, there is disposed a detector 317 in facing relation with the second aperture 307. The detector 317 detects a part of the electron-beam 302 reflected from the second aperture 307, and recognizes a surface configuration of the second aperture 307 in accordance with the detected reflection beam. Thus, a pattern of the second aperture 307 can be checked as to whether it is correctly formed. Accordingly, it is also possible to obtain data about a position of the second aperture 307 in an X-Y plane by utilizing the data on pattern checking. This technique can be used also to position the second aperture 307 relative to the substrate 308 or a semiconductor wafer, in which case a second detector 318 is disposed in facing relation with the semiconductor wafer 308 for detecting a beam reflected from the semiconductor wafer 308, as illustrated in FIG. 1.

The second aperture 307 is usually more than 100 times larger than the electron-beam 302 in size. Thus, in the above mentioned conventional method wherein a pattern of the second aperture 307 is detected on the basis of a reflected beam, and the second aperture 307 is positioned in place in accordance with the detection results, it would be necessary to scan the second aperture 307 with the electron-beam 302 in order to wholly observe the second aperture 307, which would take too much time and provide low efficiency in positioning operation. In particular, when the second aperture is to be positioned by using the electron-beam radiated to the substrate 308 through a pattern or an opening formed with the second aperture 307, it would take quite a lot of time to look for the opening because the opening has an area at about 5% or smaller than an overall area of the second aperture 307.

As mentioned earlier, the θ angle compensation is manually carried out. Hence, the electron-beam is used in order to raise accuracy in the compensation. However, it is quite difficult to carry out sufficient θ angle compensation, because the electron-beam deflects only in a small range.

SUMMARY OF THE INVENTION

It is an object of the present invention to provide an electron-beam cell projection lithography apparatus capable of positioning the second aperture with respect to both a position in X-Y directions and θ angle with high accuracy and high efficiency.

There is provided an electron-beam cell projection lithography apparatus including an electron-beam source, a first aperture through which an electron-beam transmitted from the electron-beam source passes and is shaped, a second aperture formed with an opening in a desired transfer pattern, the electron beam passing through the second aperture and being irradiated to an object, a stage movable in X and Y axes directions, the second aperture being placed on the stage, a registration mark on at least one of the second aperture and the stage, and a device, such as a microscope, for observing the registration mark to position the second aperture in place.

It is preferable that the microscope has variable magnifications such as low magnifications for observing a wide area in at least one of the second aperture and the stage and high magnifications for observing the registration mark in enlarged condition. It is also preferable that the microscope includes an objective lens disposed facing an upper surface of the stage and an eye-piece lens disposed outside a chamber containing the microscope therein. It is preferable that the microscope is designed to be able to be handled externally of the chamber to vary magnification thereof.

The registration marks may be provided at at least three locations. When there is provided a plurality of the registration marks, it is preferable that one of the registration marks is disposed in alignment with an optical axis of the microscope.

There is further provided an electron-beam cell projection lithography apparatus including an electron-beam source, a first aperture through which an electron-beam transmitted from the electron-beam source passes and is shaped, a second aperture formed with an opening in a desired transfer pattern, the electron beam adapted to pass through the second aperture and be irradiated to an object, a stage movable in X and Y axes directions, the second aperture being placed on the stage, a registration mark on at least one of the second aperture and the stage, a charge coupled device for taking images of the registration mark, a position-recognizing device for detecting dislocation between positions of the registration mark and a reference point, and a system for moving the stage to position the second aperture in accordance with output transmitted from the position-recognizing device.

It is preferable that the charge coupled device is designed to have variable image-taking range and image-taking magnifications.

The apparatus may further include a display for monitoring positional relationship between the registration mark and the reference point.

In the above mentioned apparatus, the second aperture is positioned by observing the registration mark on either the second aperture or the stage by means of either the microscope having variable magnifications or the charge coupled device. Thus, the second aperture is first roughly positioned by virtue of the registration mark by observing the second aperture and a wide area of the stage with the microscope adjusted to have low magnifications, and then accurately positioned with the microscope adjusted to have high magnifications. Thus, it is possible to align the registration mark with a predetermined reference point in a short period of time, thereby accomplishing rapid positional adjustment of the stage on which the second aperture is placed. In addition, since the second aperture can be wholly observed, it is possible to find defects and damages of a transfer pattern, thereby preventing transfer of pattern defects. In particular, the charge coupled device makes it possible to automatically stop such defects or damages from being transferred onto an object such as a semiconductor wafer, by making use of position information of those defects and damages.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 3:
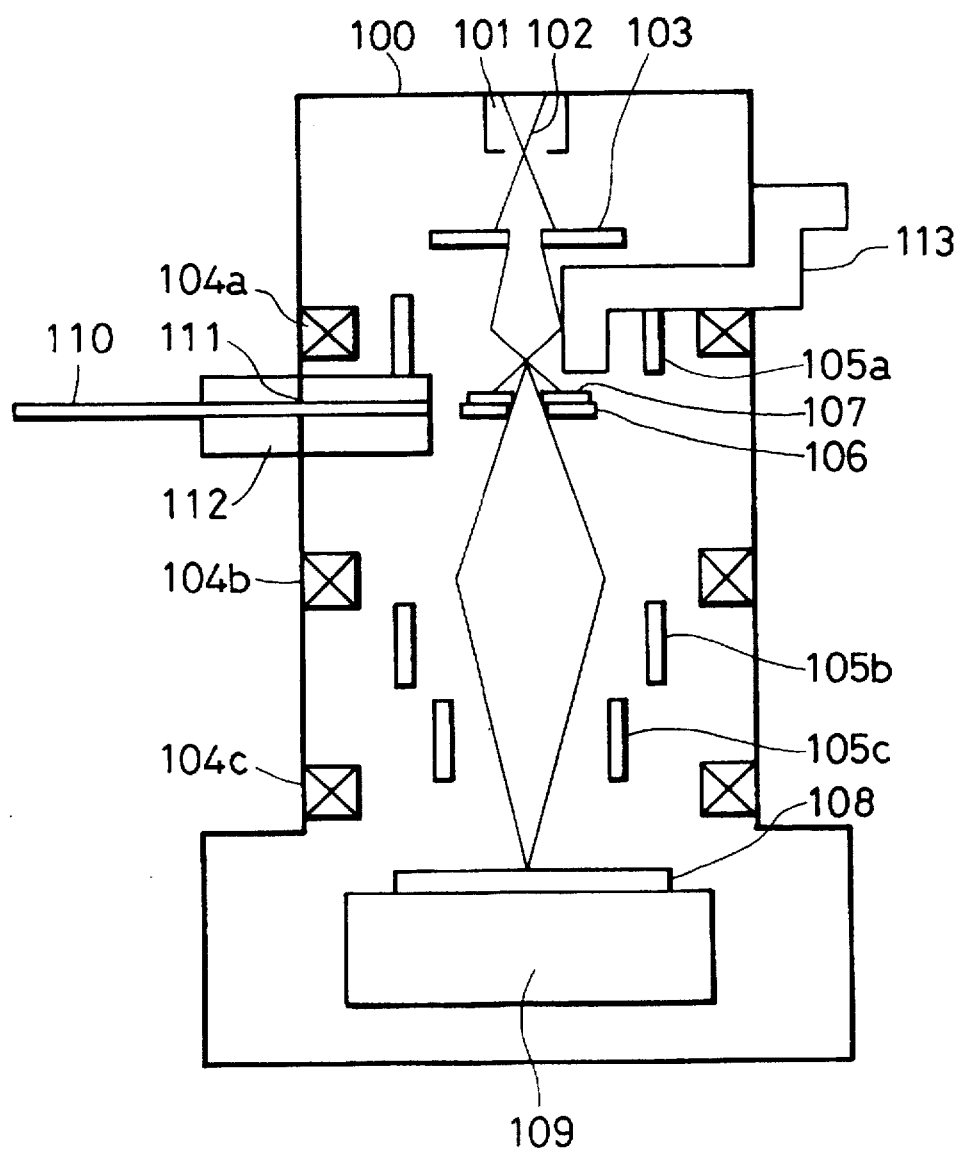
FIG. 3 is a cross-sectional view of an electron-beam cell projection lithography apparatus in accordance with the first embodiment of the present invention.

With reference to FIG. 3 illustrates an electron-beam cell projection lithography apparatus in accordance with the first embodiment, an electron-beam 102 is emitted from an electron-beam source 101 disposed in a main chamber 100, which is in a vacuum. A first aperture 103 or a first beam shaping restriction confines the electron-beam 102 into a predetermined shape, and then the thus confined electron-beam 102 is radiated to a second aperture 107 or a second beam shaping restriction placed on a stage 106 through a first beam shaping lens 104a and a first beam shaping deflector 105a. Here the second aperture 107 is formed with an opening in a pattern, and thus acts as a transfer mask. The electron-beam 102 passes through the pattern defined by the opening of the second aperture 107, and then is radiated to an object 108 such as a semiconductor wafer placed on a stage 109 through second and third beam shaping lenses 104b, 104c and beam shaping deflectors 105b, 105c. Thus, the pattern is described on the semiconductor wafer 108 at a time.

In the main chamber 100, there is disposed an optical microscope 113 in the vicinity of the stage 106 on which the second aperture 107 is placed. The optical microscope 113 is arranged passing through a sidewall of the main chamber 100, and has an objective lens disposed facing an upper surface of the stage 106, and an eye-piece lens disposed outside the main chamber 100. The optical microscope 113 is designed to be handled externally of the main chamber 100 to vary its magnification, and has an optical axis positioned to be fixed relative to the stage 106. For instance, the optical microscope 113 may include rotary type objective lenses that can be changed externally of the microscope 113, and/or may include exchangeable eye-piece lenses.

The second aperture 107 is fixed on the stage 106 at a predetermined location. The stage 106 is designed to be movable between a certain point in the main chamber 100 and a sub-chamber 112 disposed adjacent to the main chamber 100 by means of a setting rod 110, which can be handled externally of the sub-chamber 112. The sub-chamber 112 is in connection with the main chamber 100 through a leakage valve 111, and is in communication with the main chamber 100 when the leakage valve 111 is open and is shut from the main chamber 100 when the leakage valve 111 is closed.

Figure 1:
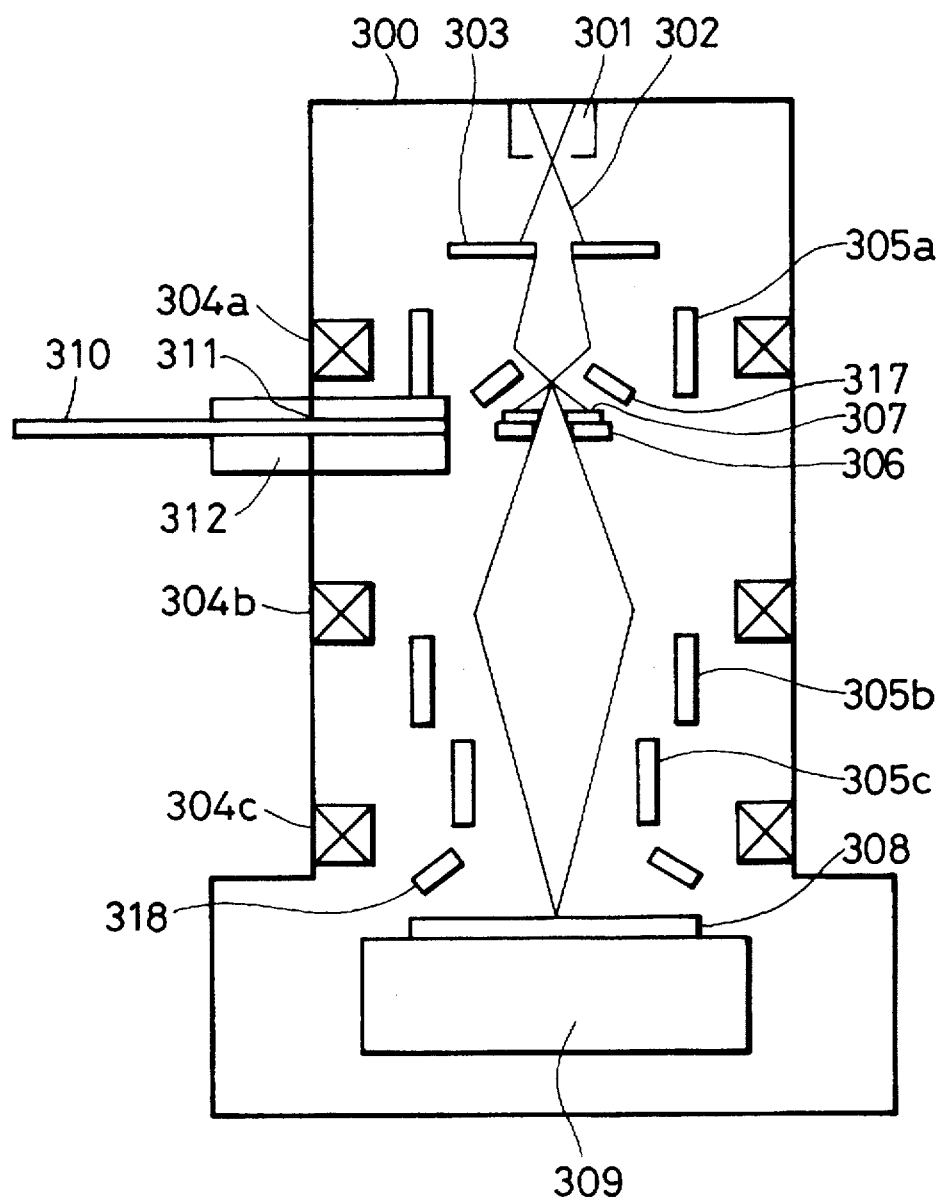
FIG. 1 is a cross-sectional view of a conventional electron-beam cell projection lithography apparatus.
Figure 2:
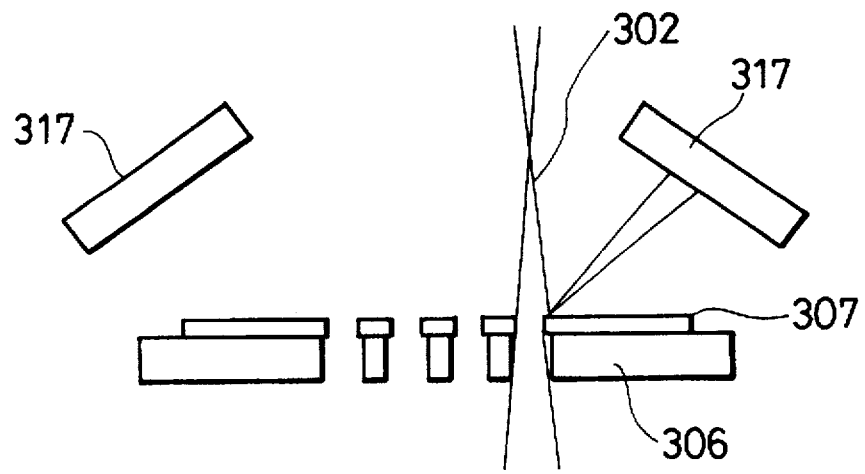
FIG. 2 is a partially enlarged view of the apparatus illustrated in FIG. 1
Figure 4:
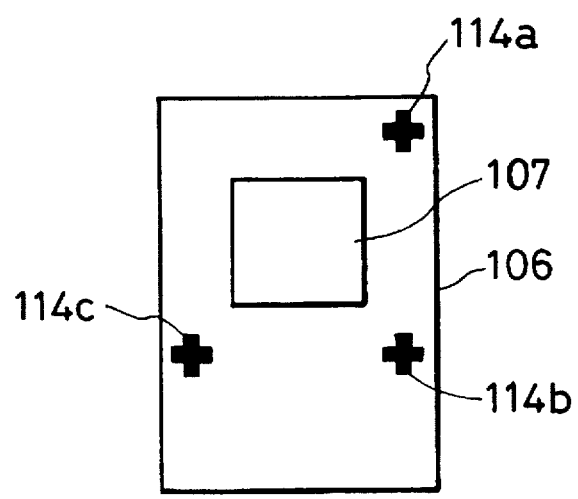
FIG. 4 is a top view of a second aperture placed on a stage with three registration marks.

As illustrated in FIG. 4, three marks 114a, 114b and 114c for registration are positioned around the second aperture 107 on the stage 106. Each of the marks 114a to 114c has predetermined X-Y coordinate values. Only the registration mark 114b is disposed in alignment with an optical axis of the optical microscope 113. It should be noted that the number of the registration marks is not to be limited to three, but four registration marks or greater also may be positioned on the stage 106. It also should be noted that the registration marks may be positioned on the second aperture 107 in place of the stage 106.

In the above mentioned lithography apparatus, the stage 106 on which the second aperture 107 is to be placed is designed to be movable in an X-Y plane. When the second aperture 107 is placed on the stage 106, the stage 106 is first moved out of the main chamber 100 and into the sub-chamber 112 disposed adjacent to the main chamber 100. In the sub-chamber 112, the second aperture 107 is placed on the stage 106, and then the θ angle compensation is manually and accurately carried out.

Then, the sub-chamber 112 is evacuated of air, and the leakage valve 111 is opened. Then, the setting rod 110 is used to push the second aperture 107 together with the stage 106 into the main chamber 100, and subsequently, the stage 106 is positioned in place and fixed there.

The second aperture 107 is positioned in place by observing the registration marks 114a to 114c with the optical microscope 113 and slightly moving the stage 106 so that the registration mark 114b is in alignment with an optical axis of the optical microscope 113. In positioning the second aperture 107, the optical microscope 113 is first arranged to have relatively low magnifications, for instance, ten magnifications, which makes it possible to easily catch the registration marks 114a to 114c within a field of view. After the registration mark 114b is roughly arranged in alignment with an optical axis of the optical microscope 113 under such relatively low magnifications, the optical microscope 113 is switched to have relatively high magnifications, for instance, 1000–2000 magnifications. Then, the registration mark 114b is accurately aligned with an optical axis of the optical microscope 113. Thus, it is possible to position the stage 106 and hence the second aperture 107 in place with quite high accuracy.

The θ angle compensation for the stage 106 on which the second aperture 107 is fixed can be accomplished by observing the three registration marks 114a to 114c by means of the optical microscope 113 and moving the stage 106 in X-Y axes directions and also a θ angle direction so that the registration marks 114a to 114c have a specific positional relationship with one another relative to an optical axis of the optical microscope 113.

As explained above, if the second aperture 107 is placed on the stage 106, it is possible to observe the registration marks 114a to 114c with the microscope 113 first at low magnifications and then at high magnifications for carrying out the registration of the stage 106 and hence the second aperture 107. Accordingly, it is possible to have a large margin for registration, and accomplish rapid registration because the registration is carried out in two steps, namely a rough registration step and an accurate registration step. In addition, since the second aperture 107 can be wholly observed by means of the optical microscope 113, it is possible to find defects and damages of a transfer pattern formed on the second aperture 107, thereby preventing transfer of pattern defects.

Figure 5:
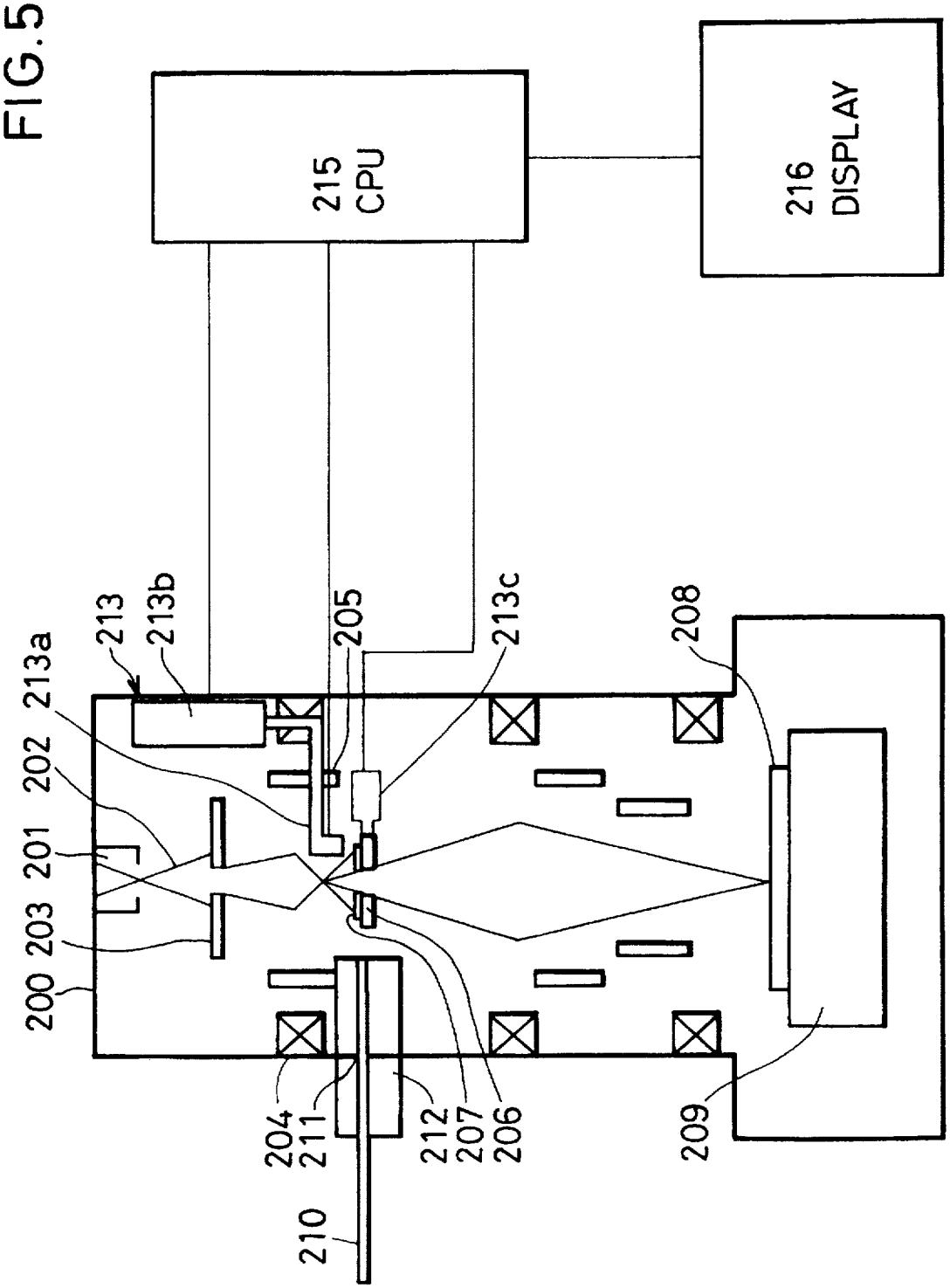
FIG. 5 is a cross-sectional view of an electron-beam cell projection lithography apparatus in accordance with the second embodiment of the present invention.

FIG. 5 illustrates an electron-beam cell projection lithography apparatus made in accordance with second embodiment of the present invention. Parts or elements that are the same or similar to those of the first embodiment illustrated in FIGS. 3 and 4 have been provided with the same last two figures. In the second embodiment, there is disposed a charge coupled device (CCD) unit 213 in a chamber 200 in place of the optical microscope 113 described in the first embodiment. The CCD unit 213 includes an image-taking device 213a having CCD therein for taking images of an upper surface of a stage 206 on which a second aperture 207 is to be placed. The CCD unit 213 also includes a position recognizing device 213b for recognizing a position of the second aperture 207, and a controller 213c for carrying out positional control for the stage 206, which is designed movable in an X-Y axes plane. The CCD image-taking device 213a, position recognizing device 213b, and the controller 213c are all in electrical connection with a central processing unit (CPU) 215, and are designed to receive control signals from the CPU 215. A display 216 is connected to CPU 215 for monitoring a positional relationship between the registration marks 114a to 114c and a reference point.

In operation, the CCD image-taking device 213a receives control signals from the CPU 215 to thereby take images of the registration marks 114a to 114c positioned on the stage 206 at low magnifications, for instance, with focal distance of an image-formation lens of the CCD image-taking device 213a being arranged short. The position recognizing device 213b determines a position of the stage 206 based on the image information provided by the CCD image-taking device 213a, and transmits signals indicating dislocation between the detected position of the stage 206 and a reference point to the CPU 215. The CPU 215 emits a control signal to the controller 213c to move the stage 206 so that the detected dislocation is minimized.

Then, the CPU 215 emits a control signal to CCD image-taking device 213a to switch the device 213a to high magnifications. Then, in the same way as mentioned earlier, the registration marks 114a to 114c are observed to thereby detect dislocation of the stage 206 from the reference point, and the CPU 215 emits a control signal to the controller 213c to move the stage 206 so that the dislocation is minimized. The positional relation between the registration marks 114a to 114c and the reference point during the registration is monitored in the display 216. Thus, it is possible to position the stage 206 and hence the second aperture 207 in place automatically and quickly.

In the above mentioned second embodiment, the CCD unit 213 is designed to find the registration marks 114a to 114c first at low magnifications for rough registration, and then at high magnifications for accurate registration. Thus, it is possible to rapidly position the second aperture 207 in place, and have a sufficiently large margin for positioning the second aperture 207. The reference point may be determined at any place by means of the CPU 215. Hence, the reference point can be determined at a desired point by providing the CPU 215 with information on a desired position at which the second aperture 207 is to be positioned. Similarly to the first embodiment, it is also possible to review a pattern formed with the second aperture 207 and check the second aperture 207 as to whether there are any defects, based on images taken by the CCD image taking device 213a. In particular, the CCD image taking device 213a makes it possible to automatically stop such defects or damages from being transferred onto the semiconductor wafer 208, by making use of the position information on those defects and damages.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications, and equivalents as can be included within the spirit and scope of the following claims.

What is claimed is:

1. An electron-beam cell projection lithography apparatus comprising:

an electron-beam source;

a first aperture through which an electron-beam transmitted from said electron-beam source passes and becomes shaped;

a second aperture formed with an opening in a desired transfer pattern, said electron beam being adapted to pass through said second aperture and irradiate an object;

a stage movable in X and Y axes directions, said second aperture being placed on said stage;

a planar registration mark positioned on at least one of said second aperture and said stage;

a chamber for containing at least said second aperture and said stage; and a microscope for observing said registration mark to position said second aperture in place, said microscope including an objective lens disposed in said chamber and facing an upper surface of said stage, and an eye-piece lens disposed outside said chamber.

2. The electron-beam cell projection lithography apparatus as set forth in claim 1, wherein said microscope has variable magnifications.

3. The electron-beam cell projection lithography apparatus as set forth in claim 1, wherein said microscope has low magnifications for observing a wide area in at least one of said second aperture and said stage, and high magnifications for observing said registration mark in enlarged condition.

4. The electron-beam cell projection lithography apparatus as set forth in claim 1, wherein said magnifications are variable from outside said chamber.

5. The electron-beam cell projection lithography apparatus as set forth in claim 1, wherein said second aperture has at least three registration marks.

6. The electron-beam cell projection lithography apparatus as set forth in claim 5, wherein one of said registration marks is disposed in alignment with an optical axis of said microscope.

7. An electron-beam cell projection lithography apparatus comprising:

an electron-beam source;

a first aperture through which an electron-beam transmitted from said electron-beam source passes and becomes shaped;

a second aperture formed with an opening in a desired transfer pattern, said electron beam being adapted to pass through said second aperture and irradiate an object;

a stage movable in X and Y axes directions, said second aperture being placed on said stage;

a registration mark positioned on at least one of said second aperture and said stage;

a charge coupled device for taking images of said registration mark;

a position-recognizing device for detecting dislocation between positions of said registration mark and a reference point; and means for moving said stage to position said second aperture in accordance with output transmitted from said position-recognizing device.

8. The electron-beam cell projection lithography apparatus as set forth in claim 7, wherein said charge coupled device has a variable image-taking range and image-taking magnifications.

9. The electron-beam cell projection lithography apparatus as set forth in claim 7, wherein said second aperture has at least three registration marks.

10. The electron-beam cell projection lithography apparatus as set forth in claim 9, wherein one of said registration marks is disposed in alignment with an optical axis of said position-recognizing device.

11. The electron-beam cell projection lithography apparatus as set forth in claim 7 further comprising a display for monitoring positional relationship between said registration mark and said reference point.

* * * * *